(12) United States Patent
Choy et al.

(10) Patent No.: US 6,853,586 B2
(45) Date of Patent: Feb. 8, 2005

(54) NON-VOLATILE MEMORY ARCHITECTURE AND METHOD THEREOF

(75) Inventors: Jon S. Choy, Austin, TX (US); Bruce L. Morton, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 162 days.

(21) Appl. No.: 10/315,279

(22) Filed: Dec. 10, 2002

(65) Prior Publication Data

US 2004/0109356 A1 Jun. 10, 2004

(51) Int. Cl.$^7$ ................................................ G11C 16/04
(52) U.S. Cl. .......................... 365/185.24; 365/185.18
(58) Field of Search ........................ 365/185.24, 185.18, 365/185.14, 185.27, 185.28

(56) References Cited

U.S. PATENT DOCUMENTS

| | | | |
|---|---|---|---|
| 5,789,776 A | | 8/1998 | Lancaster et al. |
| 6,031,760 A | * | 2/2000 | Sakui et al. ............ 365/185.21 |
| 6,122,196 A | * | 9/2000 | Tanaka et al. .......... 365/185.13 |
| 6,480,418 B2 | * | 11/2002 | Tanaka et al. .......... 365/185.13 |
| 6,512,703 B2 | * | 1/2003 | Sakui et al. ............ 365/189.05 |

FOREIGN PATENT DOCUMENTS

WO       WO 95/30244 A     11/1995

OTHER PUBLICATIONS

"Why SONOS?", Loren Lancaster, Cypress Semiconductor 2001.

* cited by examiner

*Primary Examiner*—Anh Phung
(74) *Attorney, Agent, or Firm*—Toler, Larson & Abel, LLP

(57) ABSTRACT

A memory array of one-transistor (1T) SONOS bit cells in a common-source architecture is used in conjunction with a reverse read technique to reduce the effect of read disturb. Bit line voltage in the array, during read operation, is constrained to a Vt or less, relative to the control gate, so that read disturb is limited. When information is programmed into a bit cell in the array, the bit line is used as a drain, which has the effect of concentrating charge toward the bitline end of the SONOS transistor. When information is read from a bit cell in the array, the bit line of the selected bit cell is used as a source, instead of a drain. That reversal gives a larger Vt contrast between a 0 and a 1 than a forward read, for a given amount of stored charge. Using the bit line in this manner limits the electric field to which the oxide of the bit cell is exposed, thereby lessening the amount of read disturb, while also improving the magnitude of the read mode signal and, therefore, improving overall tolerance of the read disturb effect.

15 Claims, 3 Drawing Sheets

NON-VOLATILE MEMORY ARCHITECTURE AND METHOD THEREOF

FIELD OF THE DISCLOSURE

This invention relates generally to memory architectures, and more particularly to non-volatile memories.

BACKGROUND

Programmable non-volatile memories (NVMs) are useful in many applications because they retain programmed information even if power is later removed. Like other types of electronic memories, programmable NVMs are usually constructed as an array of bit cells, with each bit cell storing one bit of information. Unlike other memory types, however, the bit cells used in many programmable NVMs permit electric charge to be injected into a storage node during programming, with the injected charge remaining in the storage node until the bit cell is erased.

One type of programmable NVM is the flash memory, which uses a floating-gate bitcell structure. Floating-gate bit cells are transistors that incorporate both a control gate and a floating gate. The control gate is used to properly bias the transistor for reading, programming or erasing, and the floating gate is used as the storage node for the bit cell. By storing different amounts of charge in the floating gate the amount of voltage needed to bias the transistor into a conduction state, commonly referred to as the voltage threshold (Vt), is altered. It is the Vt of the transistor that determines whether the bit cell represents a 1 or a 0.

Unfortunately, the floating-gate structure has at least two limitations. First, floating-gate bit cells require relatively long program and erase times compared to other bit cell types. Second, the voltages needed to inject charge into a floating-gate bit cell require transistors with relatively thick oxide layers. Another less than desirable characteristic of floating-gate memories is that a large number of process steps are needed to fabricate floating-gate bit cells as compared to the number of process steps required to manufacture other types of bit cells.

To overcome some of the limitations of floating-gate memories, other NVM architectures have been developed. Another architecture uses SONOS (Silicon-Oxygen-Nitrogen-Oxygen-Silicon) memories. SONOS memories use bit cell structures that provide several advances over floating-gate structures, including the following: 1) simplicity; 2) scalability; 3) thinner tunnel oxide; 4) reduced electric fields; and 5) directly coupled gate voltages. Unfortunately, SONOS memories generally exhibit less than perfect read disturb properties.

The term "read disturb" refers to the tendency of a bit cell to lose stored charge during memory read operations. Electric fields generated by voltages used during known read operation, when applied to a bit cell to be read, cause a small amount of stored charge to leak out. Over time, if enough charge leaks out, the state of the bit cell is changed, thereby corrupting the data stored in the bit cell.

In view of the limitations of current NVM technology discussed above, it is apparent that an NVM having improved read disturb properties combined with lower programming voltage requirements and/or increased programming speeds would be advantageous.

BRIEF DESCRIPTION OF THE DRAWINGS

Various advantages, features and characteristics of the present disclosure, as well as methods, operation and functions of related elements of structure, and the combination of parts and economies of manufacture, will become apparent upon consideration of the following description and claims with reference to the accompanying drawings, all of which form a part of this specification.

DETAILED DESCRIPTION OF THE FIGURES

FIGS. 1–7 illustrate a Non-Volatile Memory to (NVM) and method for use that results in reduced read disturb. In at least one embodiment, a memory array composed of SONOS one-transistor (1T) bit cells in a common-source architecture is used in conjunction with a reverse read technique to reduce the read disturb that would otherwise occur. When information is read from a bit cell in the array, the bit line of the selected bit cell is used as a source instead of a drain. Using the bit line in this manner limits the electric field to which the oxide of the bit cell is exposed, thereby lessening the read disturb and increasing the overall lifetime of the memory bit cell. Another advantage of various methods presented herein is that devices in the read path of the memory bit cell can be scaled to reduce their size. Scaling down is possible because devices in the bit cell's read path need not support the high voltages required to program, erase and read floating-gate bit cells of the prior art. Enabling the use of low voltage devices in the read path provides advantages related to increased speed, higher transistor gains, and the like.

Figure 1:
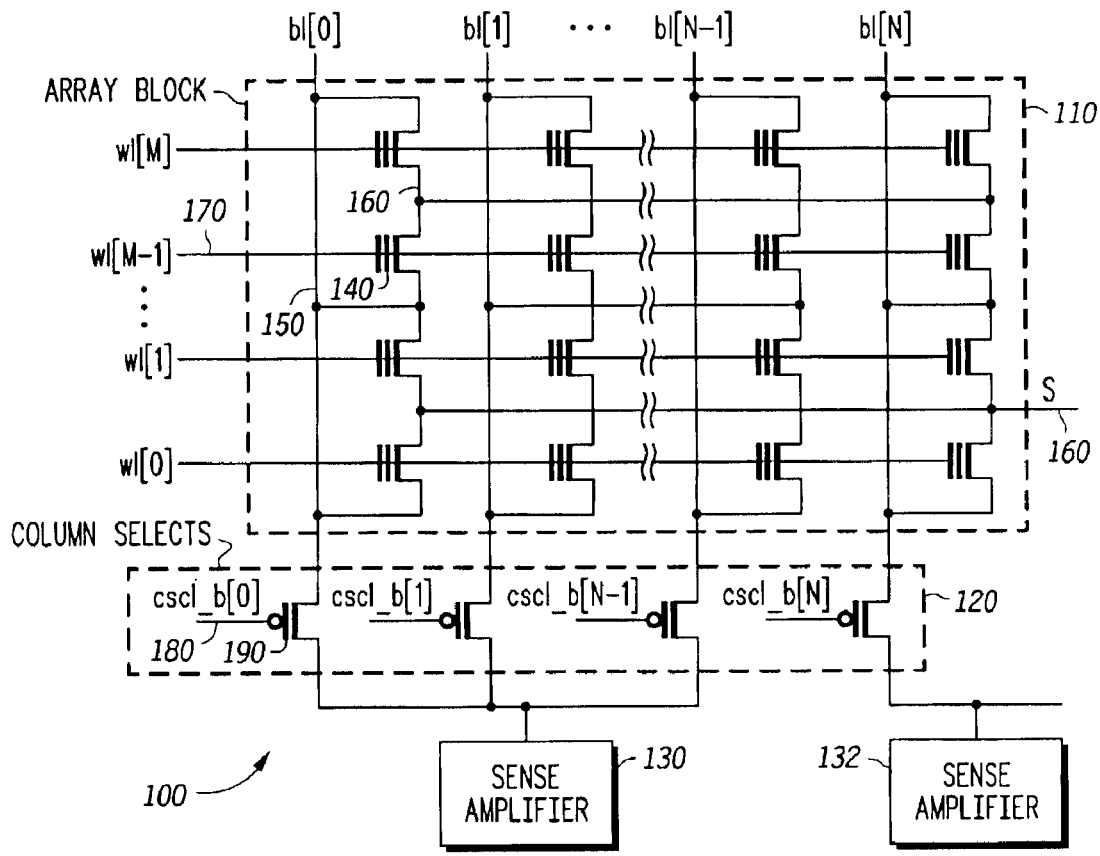
FIG. 1 is a combination block/schematic diagram illustrating a memory according to an embodiment of the present disclosure.

Referring now to FIG. 1, a memory array with associated read circuitry will be discussed according to an embodiment of the present invention. Memory 100 includes array block 110, column select circuitry 120, and sense amplifiers 130 and 132. Array block 110 includes multiple bit cells, such as bit cell 140, arranged in a matrix of columns and rows and each connected to a common-source line such as source line 160. When proper voltages are applied to a particular combination of word and bit-select lines, a corresponding bit cell is activated for reading. For example, in one embodiment, when 1.6 volts is applied to word line 170 and 0.9 volt is applied to bit line 150, then the contents of memory bit cell 140 can be read by sensing whether or not current is flowing on bit line 150. During a read operation the voltage on common source line 160 remains at 1.6 volts. In effect, the common source 160 becomes the drain of bit cell 140, and bit line 150 acts as the source.

A bit is selected for programming by applying programming-level voltages. For example, memory bit cell 140 can be programmed by applying 3 volts to bit line 150, 6 volts to word line 170, grounding common source line 160 and applying negative 2 volts (−2v) to the bulk. By applying voltages in this manner, bit line 150 is used as the drain of bit cell 140 during programming operations as opposed to being used as the source of bit cell 140 during read operations. While various techniques can be used to program bit cell 140, one embodiment of the present disclosure employs hot carrier injection (HCI) programming techniques. It will be appreciated that other embodiments of programming and erasing can be implemented. For example, Fowler/Nordheim (F/N) tunneling Erase and HCI (or enhanced HCI) programming can be used.

Consider the following embodiment of a read operation. All of the bit lines are maintained at an initialization level of VDD. When a read operation is initiated, a signal on column select line 180 is asserted, thereby biasing the gate of column select transistor 190 to place a voltage sufficient to allow current to flow through a selected bit cell. In one embodiment, a voltage somewhat less than VDD is placed on bit line 150. If bit cell 140 has been programmed to represent a value of 1 then bit cell 140 will not conduct current. If, however, bit cell 140 is programmed to represent a value of 0 then current is passed from common source 160, through bit cell 140, and onto bit line 150. The current flowing on bit line 150 passes through transistor 190, into sense amplifier 130, which senses the current. Finally, sense amplifier 130 generates an output indicating the logic value of bit cell 140.

Figure 2:
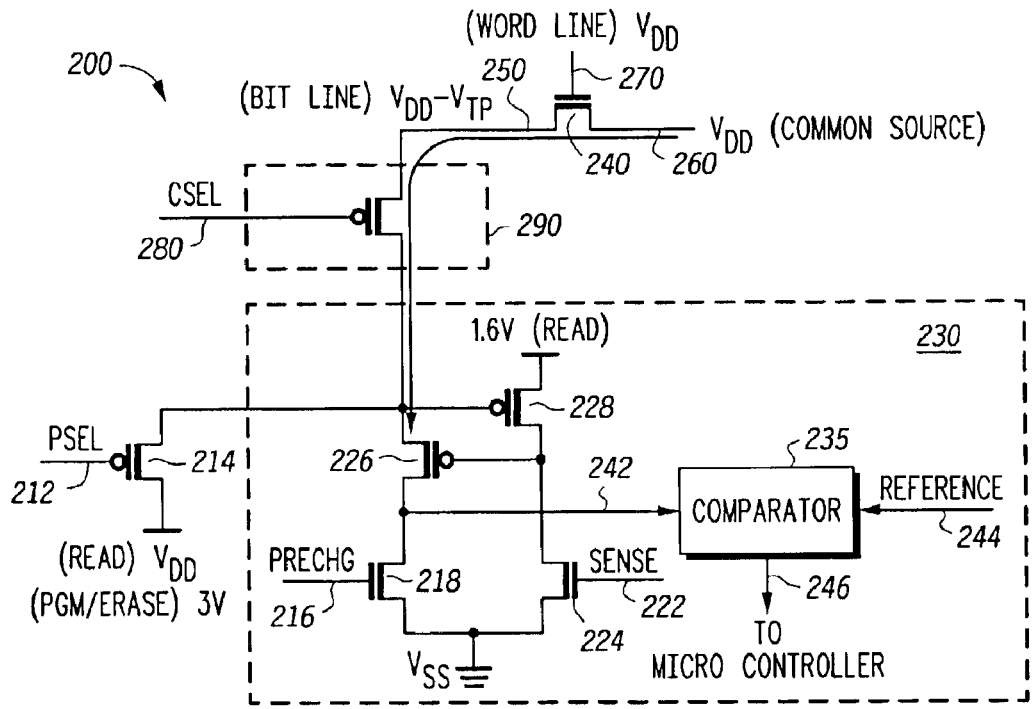
FIG. 2 is a combination block/schematic diagram illustrating a read path of a memory bit cell according to an embodiment of the present disclosure.

Referring next to FIG. 2, the read path of a memory bit cell is illustrated according to an embodiment of the present disclosure. Reference numerals in FIG. 2 which are similar to reference numerals in FIG. 1 indicate similar elements or features. The illustrated read path includes transistor 240, which is the memory bit cell; column select transistor 290 connected to transistor 240 through bit line 250; and sense amplifier 230, which includes comparator 235 and associated transistors. Program select transistor 214, which selectively applies appropriate programming or read voltages to bit line 250, is also illustrated even though transistor 214 is not in the direct read path of transistor 240. In accordance with a specific embodiment of the present disclosure, the column select transistor 290 will not be exposed to high voltages during operation and has a low voltage dielectric.

It will be appreciated by those skilled in the art that current will flow through transistor 240 whenever the voltage on word line 270 is great enough to overcome the threshold voltage (Vt) of transistor 240 and there is an appropriate voltage drop across transistor 240. The Vt of transistor 240 depends at least in part on the amount of charge stored in memory bit cell 240. So, for example, when bit cell 240 is programmed to represent a value of 1, enough charge is stored in bit cell 240 so that no current is conducted through bit cell 240 unless a relatively large voltage is placed on word line 270. If, however, there is only a small amount of charge stored in bit cell 240, such as when bit cell 240 is programmed to represent a value of 0, then transistor 240 will conduct current when a relatively small voltage is placed on word line 270. It will be apparent, therefore, that a particular voltage applied to word line 270 of bit cell 240 will cause current to flow when bit cell 240 is erased, but the same voltage will not cause current to flow when bit cell 240 is programmed with a value of 1. In effect, current will flow through bit cell 240 when the voltage on word line 270 minus bit line 250 exceeds the voltage on bit line 250 by an amount approximately equal to Vt of the bit cell and the voltage on the bit line is less than the voltage on the common source 160, to allow current to flow.

In at least one embodiment, word line 270 is maintained at VSS, and bit line 250 is maintained at VDD when bit cell 240 is not selected. Since current will flow through transistor 240 whenever the voltage difference between word line 270 and bit line 250 exceeds the threshold voltage, Vt, bit cell 240 can be read by lowering the voltage on bit line 250 by an amount about equal to or greater than the nominal threshold voltage of bit cell 240 when the word line 270 is selected.

When bit cell 240 is selected for reading, a signal on column select line 280 is asserted to enable current to flow through bit line 250 and into sense amplifier 230. Sense amplifier includes transistors 228, 226, 218, 224 and comparator 235. The sense amplifier transistors operate to provide a voltage to comparator 235 over data line 242. Comparator 235 compares the voltage on data line 242 to a reference voltage on reference line 244, and provides an appropriate output at 246.

Transistor 214 is used to apply an appropriate voltage to bit line 250, depending on whether bit cell 240 is being read, programmed, or erased. When a signal on program select line 212 is asserted during a program or erase operation, the voltage on bit line 250 is raised to 3 volts. When the signal on program select line 212 is unasserted, indicating that no program or erase operation is in progress, the voltage on bit line 250 is initialized at 1.6 (VDD) volts. Since only 3 volts is applied to bit line 250 during programming operations, the gate oxide of transistor 290 does not need to be as thick as the gate oxide required by prior art memory systems that employ higher programming voltages. A thinner gate oxide means that transistor 290 can be made smaller, resulting in increased in speed and reduced silicon fabrication costs.

Figure 3:
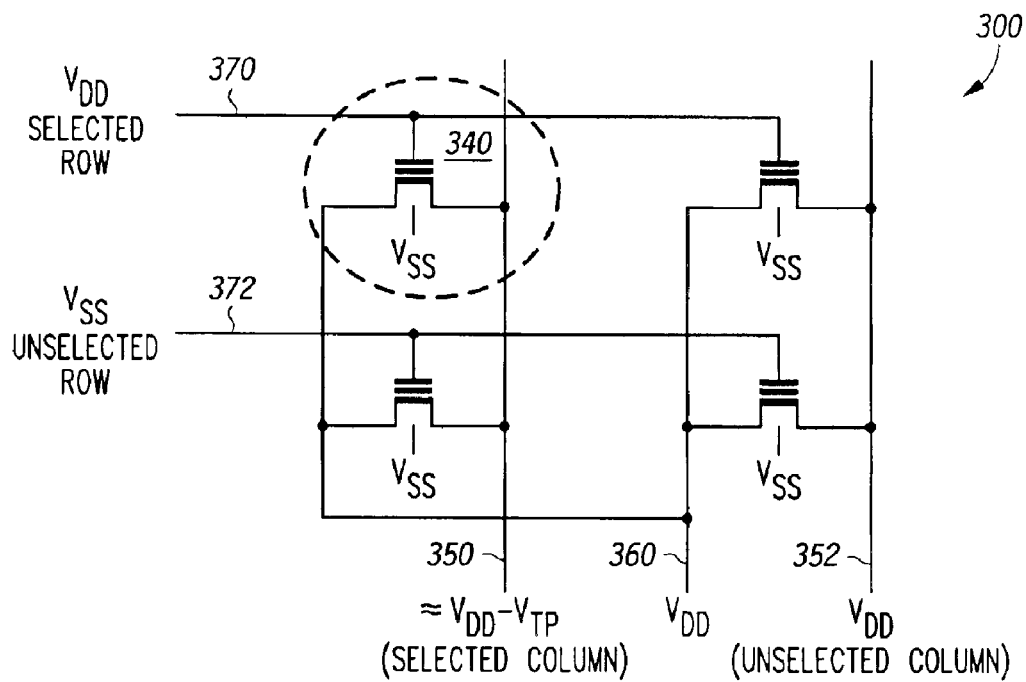
FIG. 3 is a schematic diagram illustrating the voltages applied to a selected bit cell during a read operation according to an embodiment of the present disclosure.

Referring next to FIG. 3, a read operation according to an embodiment of the present disclosure will be discussed. Reference numerals in FIG. 3 similar to reference numeral in FIGS. 1 and 2 indicate similar elements or features. In FIG. 3, bit cell 340 is shown selected for reading. During a read operation, VDD is applied to selected word line 370 and VSS is applied to unselected word line 372. VSS is also applied to the bulk of all selected and unselected bit cells. In addition to applying VDD to word line 370, a voltage of somewhat less than VDD (i.e., approximately VDD−Vtp) is applied to bit line 350 to allow current flow across a select bit cell. Although the voltage applied to bit line 350 can be constrained to have a value that is nominally VDD−Vtp, various operational and manufacturing parameters, as determined by the sense amplifier, may alter the actual voltage applied to bit line 350 to be somewhat less than the constrained value. In such a case, even though the actual voltage on bit line 350 is not exactly equal to VDD−Vtp, a read operation can still be performed.

By constraining the voltage between the gate of 340 and the bit line of 340 to nominally allow current to flow, the electric field generated during a read operation can be minimized. For example, the electric field generated across the gate 340 by conventional methods of reading information from a bit cell typically uses a voltage difference of 1.6 volts (VDD) across the gate of the bit cell. By contrast, in at least one embodiment of the present disclosure, the voltage difference across the bit cell 340 is only about 0.7–0.9 volt. It is generally accepted that the electric field generated by a potential difference of 1.6 volts will be greater than the electric field produced by a potential difference of only 0.9 volt. A smaller electric field has less effect on the charge stored in bit cell 340, thus reducing the amount of read disturb caused by a read operation.

In at least one embodiment, VDD is 1.6 volts, VSS is 0 volts, and the threshold voltage (Vt) of bit cell 340 is approximately 0.7 volts. In most conventional systems, the voltage applied to bit line 350 is greater than the common source voltage during read operations where the common source is at VDD. This requires an additional power supply to generate a voltage greater than VDD. The present disclosure teaches applying a voltage less than the common source voltage to bit line 350 during read operations. As a result, a method according to an embodiment of the present invention may employ a single power supply (not illustrated) to produce both the voltage applied to the gate of bit cell 340 (VDD) and voltage applied to bit line 350 (i.e., VDD−Vtp) during read operations.

Figure 4:
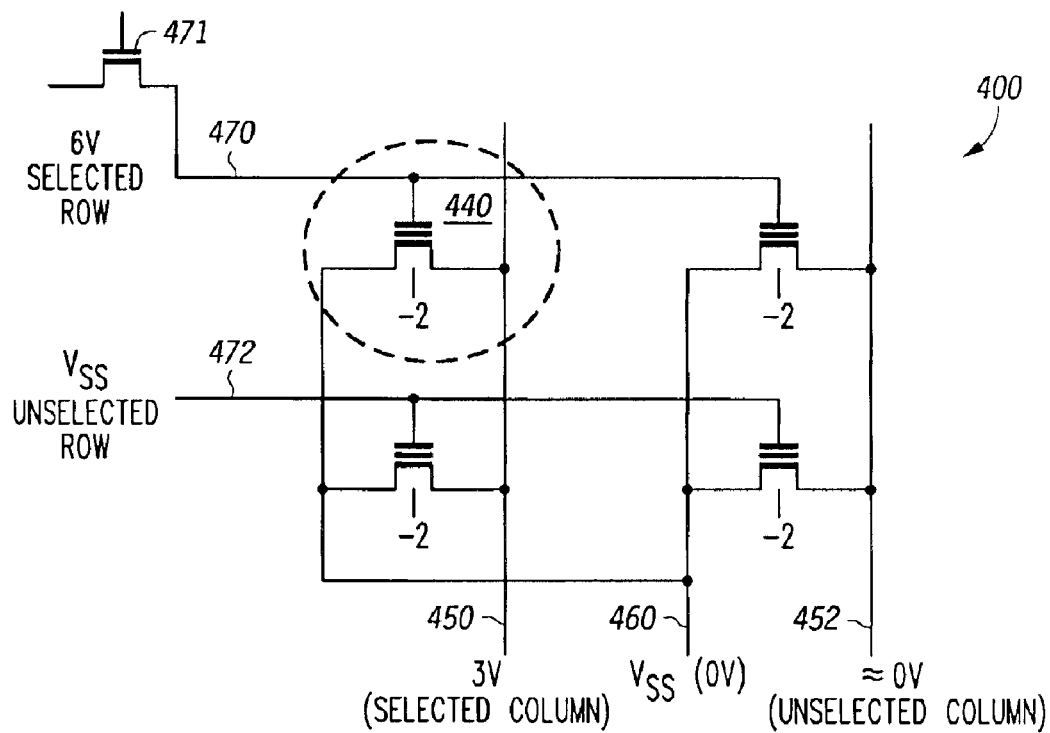
FIG. 4 is a schematic diagram illustrating voltages applied to a selected bit cell during a programming operation according to an embodiment of the present disclosure.

Referring next to FIG. 4, the method of programming a one-transistor SONOS memory will be discussed according to an embodiment of the present disclosure. Reference numerals in FIG. 4 which are like, similar or identical to reference numerals in FIGS. 1–3 indicate like, similar or identical elements or features. In FIG. 4, bit cell 440 is selected for programming by transistor 471. During programming, the bulk of each memory bit cell has a voltage of −2V applied thereto. Applying a negative two volts (−2V) to the bulk of the bit cells allows a reduced voltage to be applied to row line 470 and to bit line 450 for programming purposes. During programming, an elevated voltage relative to VDD (i.e., 6 volts) is applied to selected word line 470 and 0 volts, or VSS, is applied to unselected word lines 472. Transistor 471 will have a high-voltage dielectric to handle the voltage drop expected between its gate and source during a programming operation.

Three volts is applied to selected bit line 450, and 0 volts, or VSS, is applied to unselected bit line 452 and common source 460. Note that only 3 volts need be applied to selected bit line 450 for programming according to an embodiment of the present disclosure, whereas many conventional memories require more than 3 volts. Because various embodiments of the present disclosure place a reduced voltage (i.e. 3 volts) on selected bit line 450 during programming, transistors in the read path of bit cell 440 can be low voltage devices that need not have oxides as thick as those that would otherwise be required to support higher programming voltages.

Figure 5:
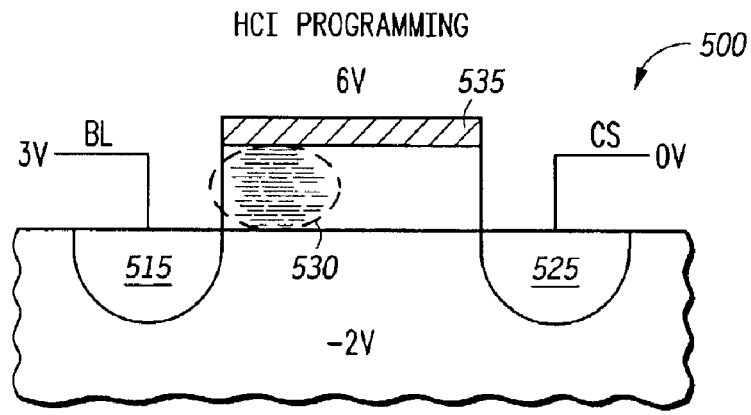
FIGS. 5–7 are a series of diagrams illustrating various access of a memory bit cell according to an embodiment of the present disclosure.
Figure 6:
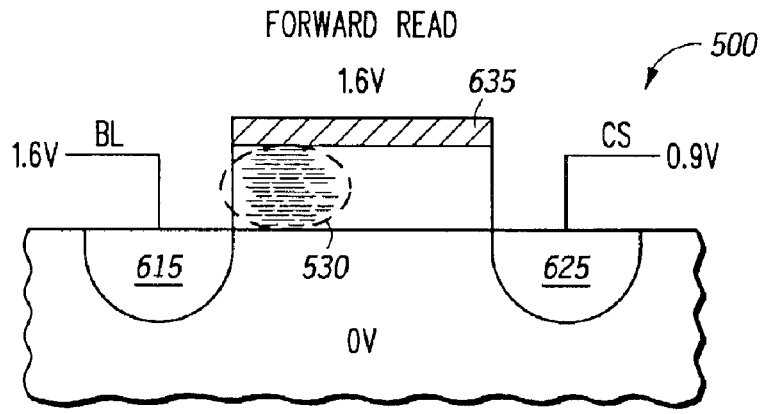
Figure 7:
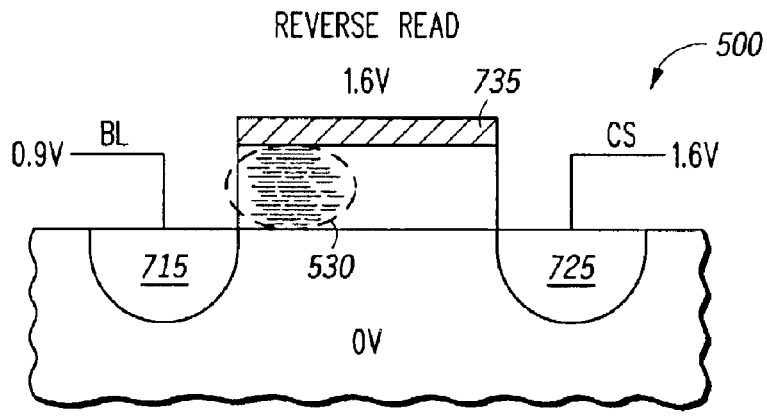

Referring next to FIGS. 5–7, a series of diagrams is illustrated showing programming, forward read, and reverse read operations according to various methods of the present disclosure. Transistor 500 shows charge 530 being stored during a programming operation. During the programming operation, 6 volts is applied to gate 535, 3 volts is applied to node 515, 0 volts is applied to node 525 and −2 volts is applied to the bulk of transistor 500. Charge 530 is stored in transistor 500 as a result of applying the voltages in the manner shown. Note that charge 530 tends to be concentrated toward the BL side of transistor 500.

If a forward read is later performed on transistor 500 (FIG. 6), current flows into transistor 500 from node 615, the same node used to inject charge during HCI programming. A forward read can be performed by applying VDD (i.e., 1.6 volts) to gate 635, VDD to node 615, and 0.9 volt to node 625. Note that 0.9 volt represents a predetermined voltage that can provide a sufficient voltage drop across transistor 500 to allow current to flow, whereby the current flow can be detected by a sense amplifier.

If a reverse read is performed on transistor 500 (FIG. 7), the voltages applied to nodes 715 and 725 are reversed. Specifically, VDD is applied to node 725, which is the common source, while 0.9 volt is applied to the node 715, the bit line. During the reverse read, the common source node, 725, becomes the drain of the transistor 500, while the bit line, node 715, becomes the source of the transistor 500.

A reverse read is preferable to a forward read because, for a given amount of stored charge 530, preferentially concentrated near the BL end of transistor 500, the reverse read results in a larger Vt contrast between the 1 and 0 states of the cell. The advantage of the larger contrast between states is that it provides greater tolerance for read disturb, for a given amount of charge stored. Consequently, reverse read may permit longer read mode endurance, or it may be used to reduce the amount of charge 530 that must be stored during programming and thereby reduce the time necessary to program transistor 500.

In summary, during a reverse read that biases the bit line in a one-transistor SONOS array as a source during read operations, and by constraining the voltage applied the bit line be approximately a Vt less than the voltage applied to the word line, read disturb can be minimized. HCI programming techniques can be used, and transistors in the read paths of the bit cells can be scaled down in size because lower programming voltages obviate the need for thick, high voltage oxides.

In the preceding detailed description of the figures, reference has been made to the accompanying drawings which form a part thereof, and in which is shown by way of illustration specific embodiments in which the invention may be practiced. These embodiments are described in sufficient detail to enable those skilled in the art to practice the invention, and it is to be understood that other embodiments may be utilized and that logical, mechanical, chemical, and electrical changes may be made without departing from the spirit or scope of the invention.

To avoid detail not necessary to enable those skilled in the art to practice the invention, the description may omit certain information known to those skilled in the art. Furthermore, many other varied embodiments that incorporate the teachings of the invention may be easily constructed by those skilled in the art. Accordingly, the present disclosure is not intended to be limited to the specific form set forth herein, but on the contrary, it is intended to cover such alternatives, modifications, and equivalents, as can be reasonably included within the spirit and scope of the invention. The preceding detailed description is, therefore, not to be taken in a limiting sense, and the scope of the present disclosure is defined only by the appended claims.

What is claimed is:

1. A method comprising:
    applying a first voltage to a gate of a bitcell to be read;
    applying the first voltage to a first current electrode of the bitcell;
    applying a second voltage to a bulk of the bitcell; and
    applying a third voltage to a second current electrode of the bitcell, wherein the third voltage is chosen to have a magnitude less than the magnitude of the first voltage to allow a detectable amount of current to flow through the second current electrode when the bitcell is discharged to a low voltage threshold state.

2. The method as in claim 1, wherein the method of applying the third voltage is constrained to be within a voltage threshold of the first voltage.

3. The method as in claim 2, wherein the first voltage is a power supply voltage.

4. The method as in claim 1, wherein the first voltage and the third voltage are obtained from a single supply.

5. The method as in claim 1, wherein the bitcell is a SONOS non-volatile memory bitcell.

6. The method as in claim 1, further comprising programming the bitcell using a hot-carrier injection technique.

7. The method as in claim 1, further comprising erasing the bitcell using a Fowler/Nordheim technique.

8. The method as in claim 1, wherein applying the third voltage comprises applying the third voltage through a column select transistor having a low-voltage gate dielectric.

9. The method as in claim 8, wherein applying first voltage comprises applying the first voltage through a wordline select transistor having a high-voltage gate dielectric.

10. The method of claim 1, wherein applying first voltage comprises applying the first voltage through a wordline select transistor having a high-voltage gate dielectric.

11. A method comprising:

setting a voltage threshold state of a memory cell to a first charge state by supplying charge to the memory cell through a first current electrode of the memory cell; and reading the first charge state of the memory cell comprises receiving a detectable amount of charge at the first current electrode from the memory cell when the memory cell has the voltage threshold at the first charge state.

12. The method as in claim 11, wherein the voltage applied to a second current electrode is greater than a voltage applied to the first current electrode.

13. The method as in claim 11, wherein the memory cell is a SONOS non-volatile memory bitcell.

14. The method as in claim 11, wherein setting the voltage threshold state of the memory cell comprises programming the memory cell using a hot-carrier injection technique.

15. The method as in claim 11, wherein setting further comprises erasing the memory cell using a Fowler/Nordheim technique.

* * * * *